US010622222B2

(12) United States Patent
Chuang et al.

(10) Patent No.: US 10,622,222 B2
(45) Date of Patent: *Apr. 14, 2020

(54) INTEGRATED FAN-OUT PACKAGE HAVING MULTI-BAND ANTENNA AND METHOD OF FORMING THE SAME

(71) Applicant: Taiwan Semiconductor Manufacturing Co., Ltd., Hsinchu (TW)

(72) Inventors: Nan-Chin Chuang, Taipei (TW); Ching-Feng Yang, Taipei (TW); Kai-Chiang Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/429,081

(22) Filed: Jun. 3, 2019

(65) Prior Publication Data

US 2019/0287819 A1 Sep. 19, 2019

Related U.S. Application Data

(63) Continuation of application No. 15/627,457, filed on Jun. 20, 2017, now Pat. No. 10,312,112.

(51) Int. Cl.
*H01L 21/56* (2006.01)
*H01L 23/538* (2006.01)
(Continued)

(52) U.S. Cl.
CPC ........ *H01L 21/561* (2013.01); *H01L 21/6835* (2013.01); *H01L 21/762* (2013.01); *H01L 21/76254* (2013.01); *H01L 23/5389* (2013.01); *H01L 24/20* (2013.01); *H01L 24/25* (2013.01); *H01L 23/3128* (2013.01); *H01L 24/13* (2013.01); *H01L 24/19* (2013.01); *H01L 24/24* (2013.01); *H01L 2221/68359* (2013.01); *H01L 2221/68372* (2013.01); *H01L 2221/68381* (2013.01); *H01L 2223/6677* (2013.01);
(Continued)

(58) Field of Classification Search
CPC ........ H01L 24/19; H01L 24/20; H01L 23/31; H01L 23/312; H01L 23/3128; H01L 23/53; H01L 23/538; H01L 23/5389; H01L 21/56; H01L 21/561; H01L 21/76; H01L 21/762; H01L 21/7625; H01L 21/76254
USPC ........................................................ 257/686
See application file for complete search history.

(56) References Cited

U.S. PATENT DOCUMENTS 10,312,112 B2 * 6/2019 Chuang ............... H01L 21/6835

* cited by examiner

*Primary Examiner* — Monica D Harrison
(74) *Attorney, Agent, or Firm* — JCIPRNET

(57) ABSTRACT

An integrated fan-out package having a multi-band antenna and a method of forming the same are disclosed. An integrated fan-out package includes a semiconductor die, a molding layer and a plurality of through integrated fan-out vias. The molding layer is aside the semiconductor die. The through integrated fan-out vias are through the molding layer and arranged to form a plurality of dipole antennas. At least one of the plurality of dipole antennas includes two dipole arms each having a transmitting strip and a radiating strip connected to the transmitting part, and the radiating strip has a first part, a second part and a filter part between and in contact with the first part and the second part. The cross-sectional area of the filter part is less than the cross-sectional area of the first part or the second part of the radiating strip.

20 Claims, 12 Drawing Sheets

(51) Int. Cl.
*H01L 21/762* (2006.01)
*H01L 23/00* (2006.01)
*H01L 21/683* (2006.01)
*H01L 23/31* (2006.01)

(52) U.S. Cl.
CPC ............... *H01L 2224/02379* (2013.01); *H01L 2224/04105* (2013.01); *H01L 2224/05569* (2013.01); *H01L 2224/1145* (2013.01); *H01L 2224/1146* (2013.01); *H01L 2224/11334* (2013.01); *H01L 2224/12105* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/18* (2013.01); *H01L 2224/24227* (2013.01); *H01L 2224/25171* (2013.01); *H01L 2224/2919* (2013.01); *H01L 2224/32225* (2013.01); *H01L 2224/82005* (2013.01); *H01L 2224/83005* (2013.01)

INTEGRATED FAN-OUT PACKAGE HAVING MULTI-BAND ANTENNA AND METHOD OF FORMING THE SAME

CROSS-REFERENCE TO RELATED APPLICATION

This application is a continuation application of and claims the priority benefit of a prior application Ser. No. 15/627,457, filed on Jun. 20, 2017. The entirety of the above-mentioned patent application is hereby incorporated by reference herein and made a part of this specification.

BACKGROUND

Assembling several integrated circuits required by a system in a single package is now a common practice for complex electronic systems, and is often referred to as system-in-package (SIP). A SIP assembly may contain digital, analog, mixed-signal, and often radio-frequency functions in a single package. For SIP applications, a multi-band antenna designed to transmit or receive different electromagnetic waves is applied for millimeter wave wireless communication, WiFi, and telecommunication, etc. However, there are many challenges related to such multi-band antenna.

DETAILED DESCRIPTION

Figure 1A:
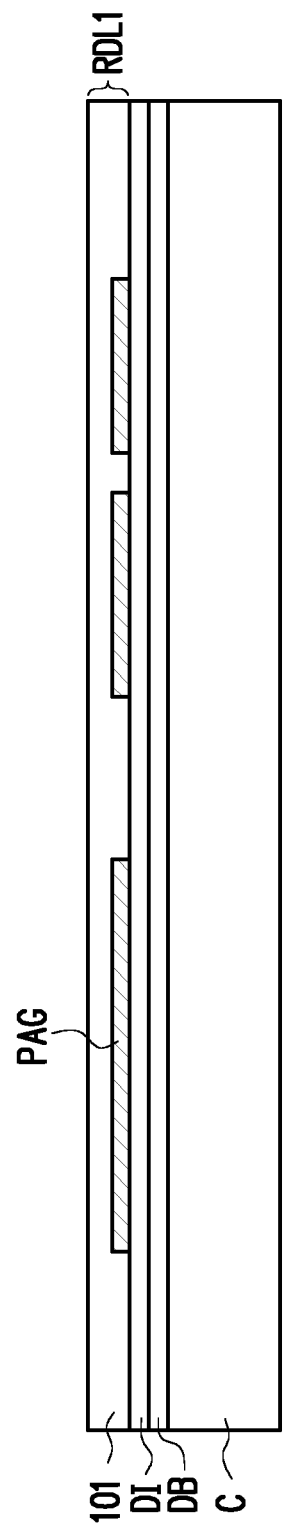
FIG. 1A to FIG. 1F are cross-sectional views of a method of forming an integrated fan-out package having a multi-band antenna in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
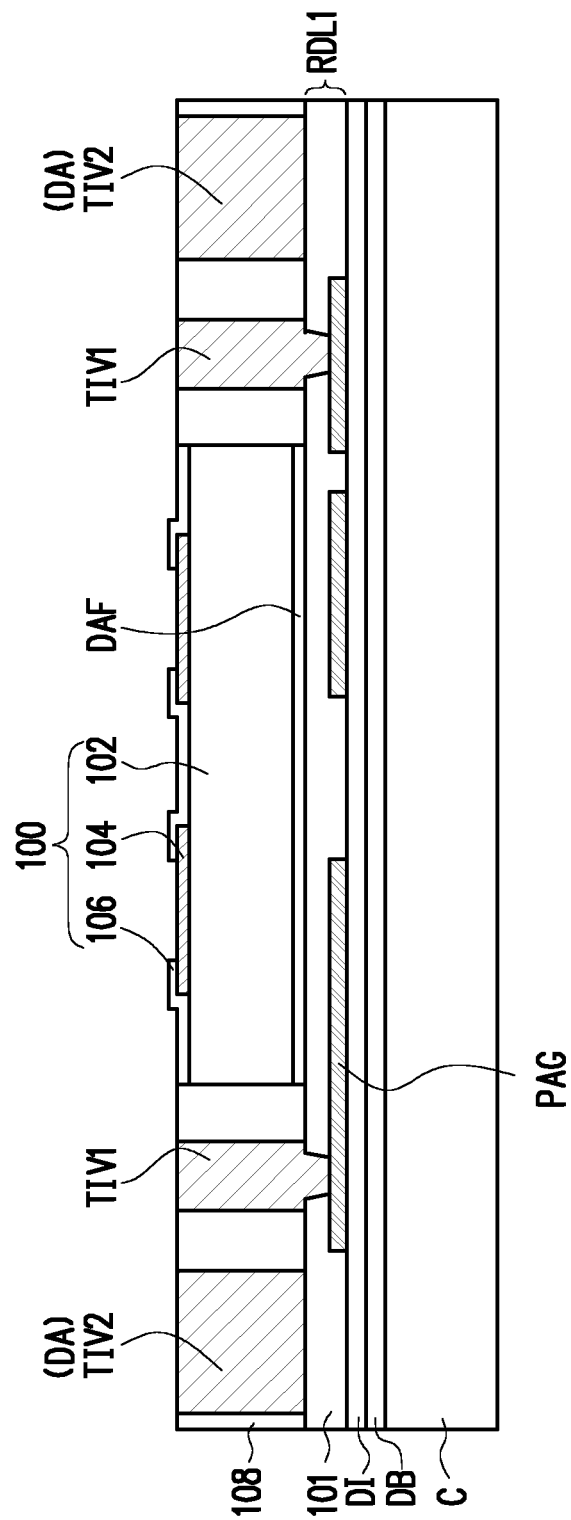
Figure 1C:
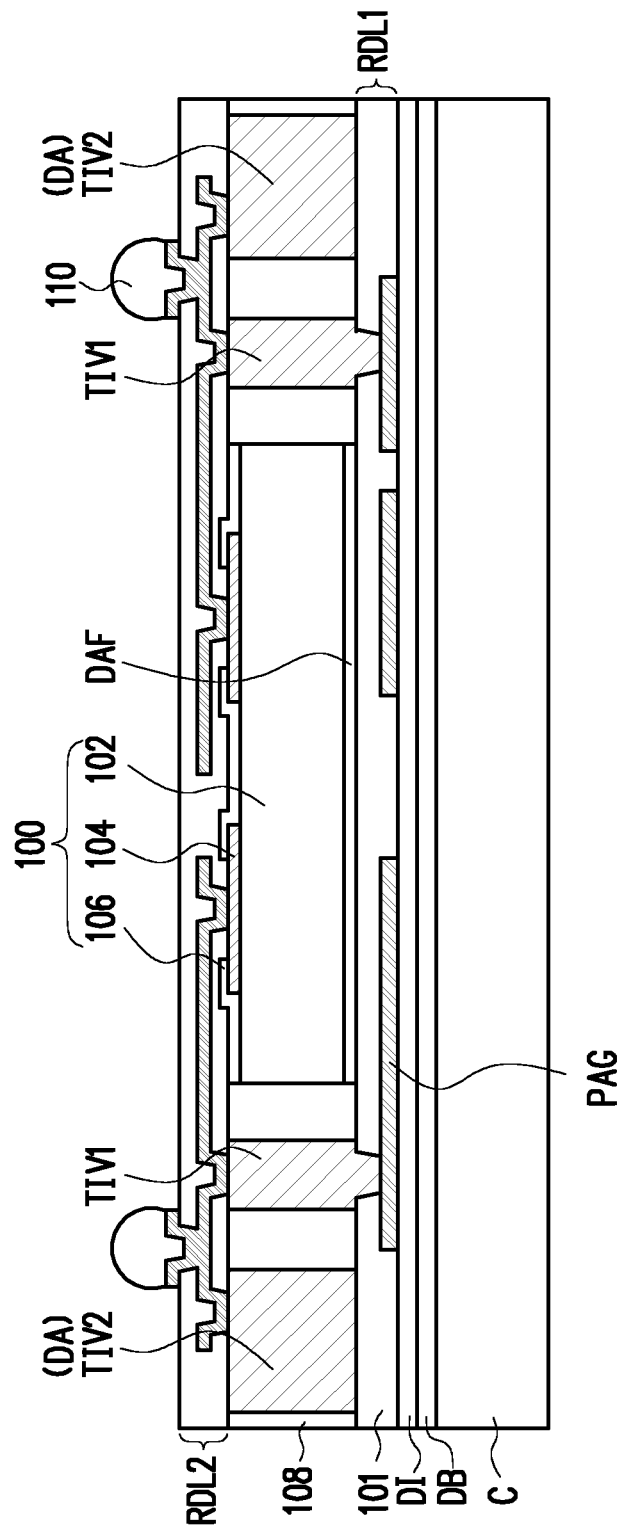
Figure 1D:
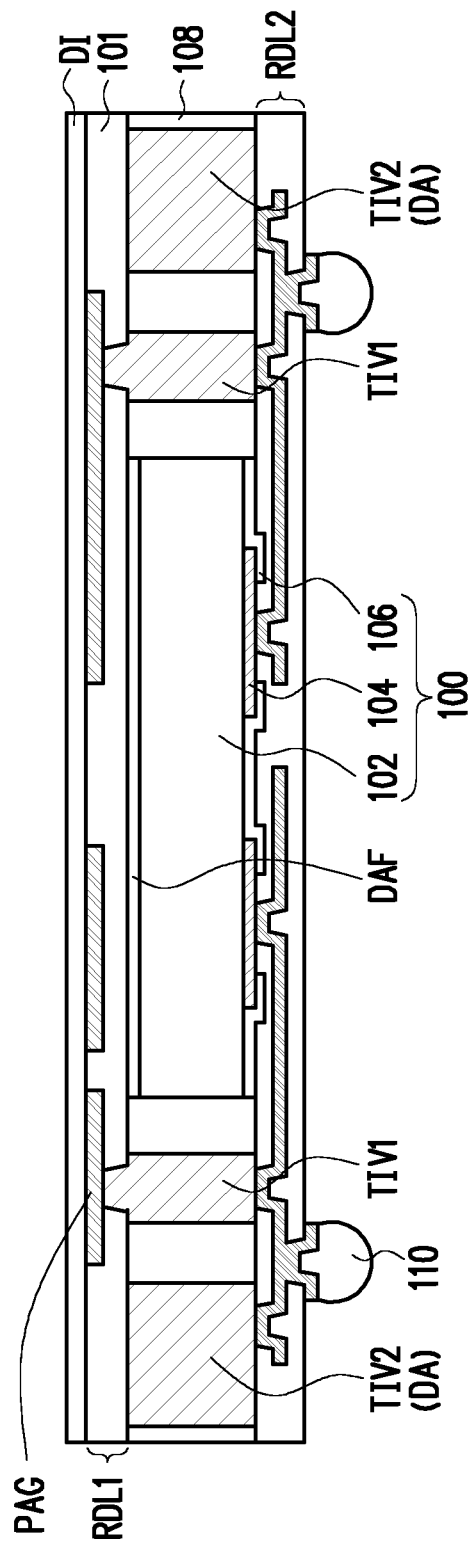
Figure 1E:
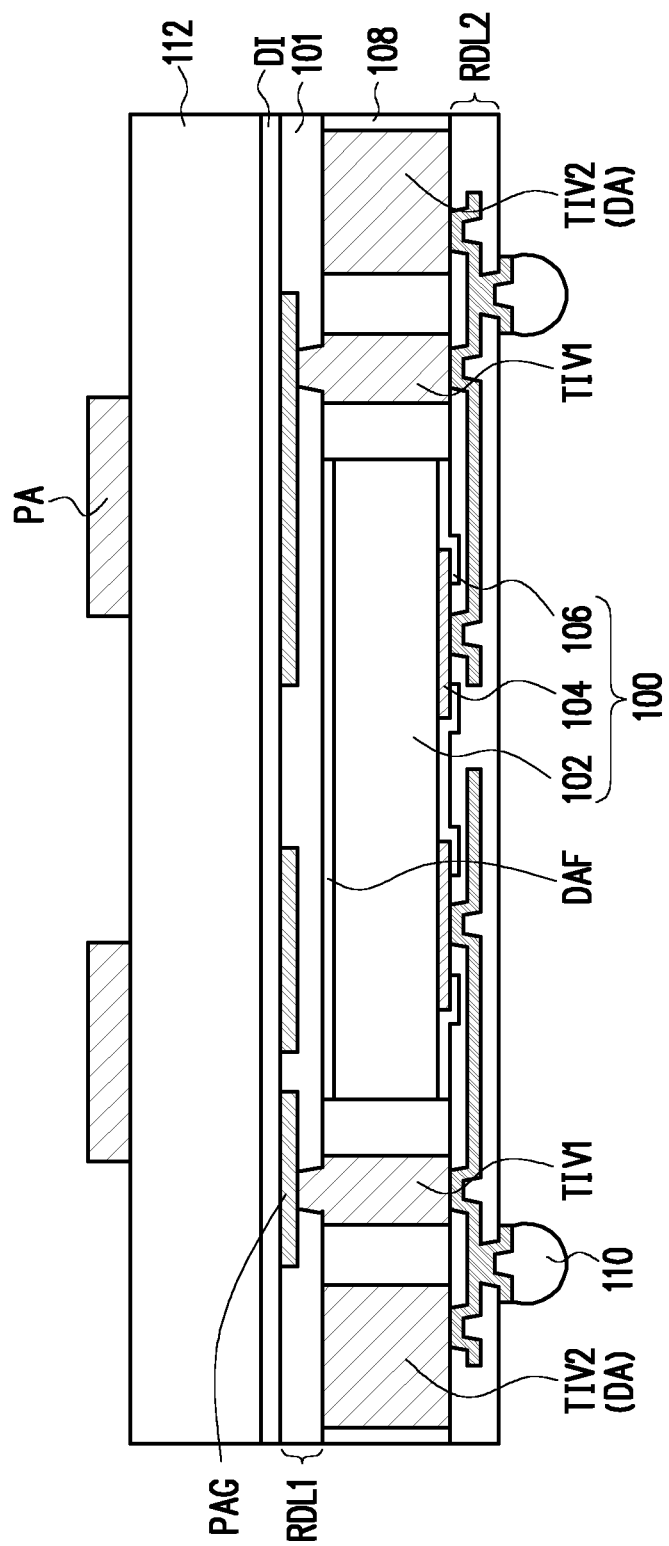
Figure 1F:
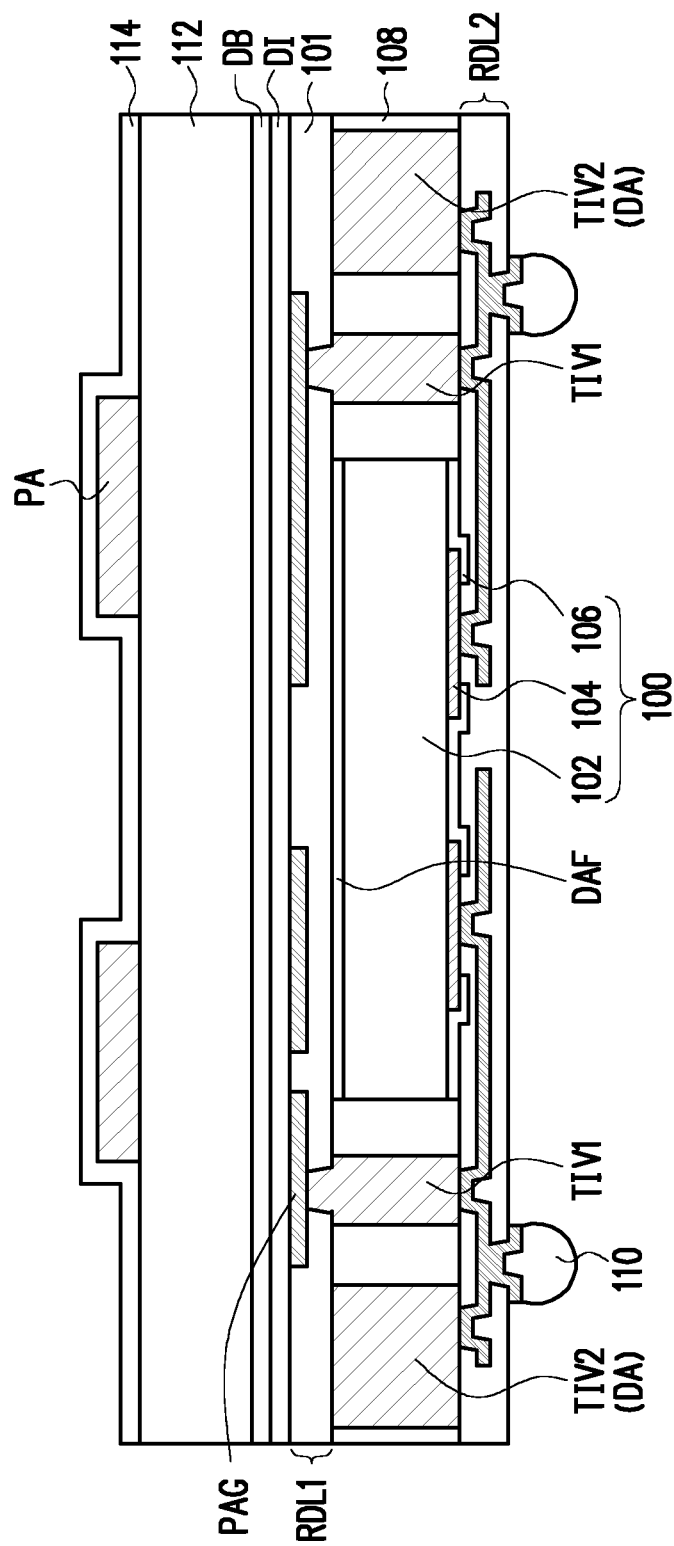

FIG. 1A to FIG. 1F are cross-sectional views of a method of forming an integrated fan-out package having a multi-band antenna in accordance with some embodiments. FIG. 1F is a simplified top view taken along the line I-I of FIG. 2. For simplicity and clarity of illustration, only few elements such as dipole antennas and patch antennas are shown in the simplified top view of FIG. 2, and these elements are not necessarily in the same plane, as shown in FIG. 1F.

Referring to FIG. 1A, a carrier C is provided with a de-bonding layer DB and a dielectric layer DI formed thereon, and the de-bonding layer DB is between the carrier C and the dielectric layer DI. In some embodiments, the carrier C is a glass substrate, the de-bonding layer DB is a light-to-heat conversion (LTHC) release layer, and the dielectric layer DI is a polymer layer such as polybenzoxazole (PBO), polyimide (PI), benzocyclobutene (BCB), a combination thereof or the like.

Thereafter, a first redistribution layer structure RDL1 is formed on the dielectric layer DI. The first redistribution layer structure RDL1 is referred to as a "backside redistribution layer structure" through the specification. In some embodiments, a patch antenna ground PAG is formed during the formation of the first redistribution layer structure RDL1. Specifically, the first redistribution layer structure RDL1 includes a redistribution layer embedded in a polymer layer 101, and the redistribution layer is arranged to form a patch antenna ground PAG. In some embodiments, the patch antenna ground PAG includes a plurality of ground patterns. In some embodiments, the redistribution layer or the patch antenna ground PAG includes copper, nickel, titanium, a combination thereof, or the like. In some embodiments, the polymer layer 101 includes a photo-sensitive material such as polybenzoxazole (PBO), polyimide (PI), benzocyclobutene (BCB), a combination thereof or the like. In alternative embodiments, more polymer layers and redistribution layers can be included in the first redistribution layer structure RDL1, and the polymer layers and the redistribution layers are stacked alternately. The number of the polymer layers or redistribution layers is not limited by the present disclosure.

Referring to FIG. 1B, a plurality of through integrated fan-out vias TIV1 and TIV2 are formed on the first redistribution layer structure RDL1. In some embodiments, the through integrated fan-out vias TIV1 penetrate through the polymer layer 101 and are electrically connected to the patch antenna ground PGA, and the through integrated fan-out vias TIV2 are formed on the polymer layer 101. In some embodiments, the through integrated fan-out vias TIV2 are arranged to form a plurality of dipole antennas DA. Specifically, the dipole antennas DA are formed during the formation of the through integrated fan-out vias.

In some embodiments, the method of forming the through integrated fan-out vias TIV1 and TIV2 includes the following operations. A seed material layer (not shown) is formed over the first redistribution layer structure RDL1. In some embodiments, the seed material layer includes a titanium/copper composite layer, and is formed by a sputtering process. Thereafter, a photoresist layer (not shown) with openings is formed on the seed material layer, and the openings of the photoresist layer expose the intended locations for the subsequently formed through integrated fan-out vias. Afterwards, a plating process is performed to form a metal material layer (e.g., a copper layer) on the seed material layer exposed by the openings of the photoresist layer. The photoresist layer and the underlying seed material layer are then removed to form the through integrated fan-out vias TIV1 and TIV2.

In some embodiments, the through integrated fan-out vias TIV2 or dipole antennas DA have a dimension (e.g., width) greater than that of the through integrated fan-out vias TIV1. However, the present disclosure is not limited thereto. In alternative embodiments, the through integrated fan-out vias TIV2 or dipole antennas DA have a dimension (e.g., width) substantially equal to or less than that of the through integrated fan-out vias TIV1.

Figure 2:
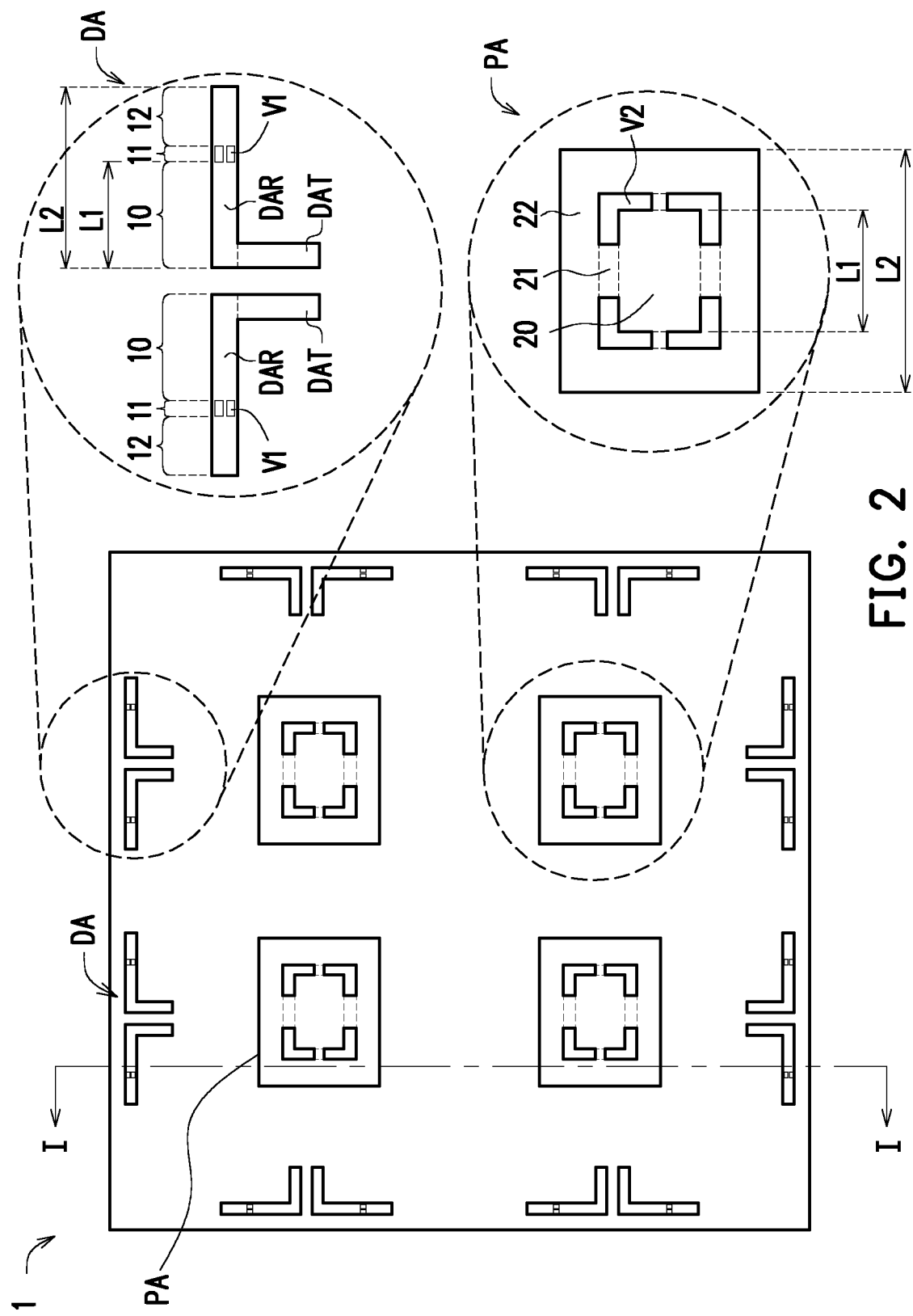
FIG. 2 is a simplified top view of an integrated fan-out package having a multi-band antenna in accordance with some embodiments.

In some embodiments, each of the dipole antennas DA includes two dipole arms, as shown in FIG. 2. The dipole arms may be identical conductive elements which are usually bilaterally symmetrical. In some embodiments, each of the dipole arms has a transmitting strip DAT and a radiating strip DAR connected to transmitting strip DAT. The transmitting strips DAT are configured to transmit and/or receive signals of different frequency bands, and the radiating strips DAR are configured to radiate different frequency bands.

In some embodiments, each dipole antenna DA has two L-shaped dipole arms, in which the transmitting strips DAT are arranged side by side and paralleled to each other, and the radiating strips DAR extend from the transmitting strips DAT in opposite directions. In some embodiments, the inclined angle between the adjacent transmitting strip DAT and radiating strip DAR is about 90 degrees, but the disclosure is not limited thereto. In alternative embodiments, the inclined angle between the adjacent transmitting strip DAT and radiating strip DAR can be greater than or less than 90 degrees upon the process requirements.

Hereinafter, one dipole arm of each dipole antenna DA is described below for simplicity and clarity of illustration. In some embodiments, the radiating strip DAR has a first part 10, a filter part 11 and a second part 12. The filter part 11 is between and in physical contact with the first part 10 and the second part 12.

In the disclosure, the filter part 11 of the radiating strip DAR of the dipole antenna DA is configured to filter signals of different frequency bands. In some embodiments, the filter part 11 of the radiating strip DAR blocks a first operating frequency band but permits a second operating frequency band to pass therethrough. Specifically, by disposing the filter part 11 in the radiating strip DAR of the dipole antenna DA, the first part 10 of the radiating strip DAR radiates a first frequency band, and the entire radiating strip DAR (including the first part 10, the filter part 11 and the second part 12) radiates a second frequency band different from the first frequency band. In some embodiments, the first frequency band is greater than the second frequency band. For example, the first frequency band of the dipole antenna DA is 60 GHz, and the second frequency band of the dipole antennas DA is 38 GHz.

The antenna dimensions are inverse proportional with the frequencies. Therefore, the dipole antenna DA can irradiate different frequency bands by controlling the length L1 of the first part 10 and the total length L2 of all parts of the radiating strip DAR thereof. For example, when the first frequency band is 60 GHz and the second frequency band is 38 GHz, the length L1 and the length L2 are in a ratio of 1/60:1/38.

In some embodiments, the cross-sectional area of the filter part 11 is less than the cross-sectional area of the first part 10 or the second part 12 of the radiating strip DAR. In some embodiments, the cross-sectional area of the first part 10 is substantially equal to the cross-sectional area of the second part 12. In alternative embodiments, the cross-sectional area of the first part 10 can be different from (e.g., greater than) the cross-sectional area of the second part 12.

In some embodiments, the filter part 11 of the radiating strip DAR has one or more voids V1 therein. In some embodiments, as shown in the top view of FIG. 2, two voids V1 are provided in the filter part 11 of the radiating strip DAR. In some embodiments, the voids V1 penetrate through the filter part 11 of the radiating strip DAR. In alternative embodiments, the voids V1 do not penetrate through the filter part 11 of the radiating strip DAR. The voids V1 may be square, rectangular, polygonal, round, elliptical, strip-shaped or any shape. The size and the shape of the voids V1 can be adjusted until the filter part 11 has the desired filtering function.

Continue referring to FIG. 1B, after the through integrated fan-out vias TIV1 and TIV2 are formed, a semiconductor die 100 is picked and placed on the carrier C. In some embodiments, the semiconductor die 100 includes a substrate 102, connectors 104 and an insulating layer 106. The substrate 102 includes, for example but not limited to, bulk silicon, doped or undoped, or an active layer of a semiconductor-on-insulator (SOI) substrate. The connectors 104 are formed over and electrically connected to underlying pads or an interconnection structure (not shown). The connectors 104 include solder bumps, gold bumps, copper pillars or the like, and are formed with a ball drop process or an electroplating process. The insulating layer 106 is formed over the substrate 102 and exposes portions of the connectors 104. In some embodiments, the insulating layer 106 is a polymer layer. For example, the insulating layer 106 includes a photo-sensitive material such as polybenzoxazole (PBO), polyimide, benzocyclobutene (BCB), a combination thereof, or the like. In some embodiments, the semiconductor die 100 is attached to the dielectric layer DI with a die attach film DAF therebetween.

Thereafter, a molding layer 108 is formed over the carrier C to encapsulate or surround the sidewalls of the through integrated fan-out vias TIV1 and TIV2 and the sidewall of the semiconductor die 100. In some embodiments, a mold with a mold cavity (not shown) is pressed against the semiconductor die 100, and the molding cavity is then filled with a molding material to form the molding layer 108. In some embodiments, the molding layer 108 includes a molding compound, a molding underfill, a resin or the like, such as epoxy. In some embodiments, the molding layer 108 includes a photo-sensitive material such as polybenzoxazole (PBO), polyimide, benzocyclobutene (BCB), a combination thereof, or the like. In some embodiments, the molding layer 108 further fills in the voids V1 in the filter part 11 of each radiating strip DAR of the dipole antenna DA.

Referring to FIG. 1C, a second redistribution layer RDL2 is formed over the molding layer 108. The second redistribution layer structure RDL2 is referred to as a "front-side redistribution layer structure" through the specification. In some embodiments, the second redistribution layer structure RDL2 is electrically connected to the connectors 104 of the semiconductor die 100 and the through integrated fan-out vias TIV1 and TIV2. In some embodiments, the second redistribution layer structure RDL2 includes a plurality of polymer layers and a plurality of redistribution layers stacked alternately. The number of the polymer layers or redistribution layers is not limited by the disclosure. In some embodiments, the topmost redistribution layer is also called an under-ball metallurgy (UBM) layer for ball mount. In some embodiments, each of the polymer layers includes a photo-sensitive material such as polybenzoxazole (PBO), polyimide, benzocyclobutene (BCB), a combination thereof, or the like. In some embodiments, each of the redistribution layers includes copper, nickel, titanium, a combination thereof, or the like, and is formed by an electroplating process.

Thereafter, balls or bumps 110 are formed over and electrically connected to the second redistribution layer structure RDL2. In some embodiments, the bumps 110 are made of a conductive material with low resistivity, such as Sn, Pb, Ag, Cu, Ni, Bi or an alloy thereof, and are formed by a suitable process such as evaporation, plating, ball drop, or screen printing.

Referring to FIG. 1D, the carrier C is de-bonded. In some embodiments, the carrier C with the semiconductor die 100, the molding layer 108, the first and second redistribution layer structures RDL1 and RDL2 is turned over, the de-bonding layer DB is decomposed under heat of light, and the carrier C is then released from the backside or first side of the semiconductor die 100.

Referring to FIG. 1E, an insulating layer 112 is formed over the backside or first side of the semiconductor die 100. Specifically, the insulating layer 112 is formed on the dielectric layer DI. In some embodiments, the insulating layer 112 is a polymer layer. For example, the insulating layer 106 includes a photo-sensitive material such as poly-benzoxazole (PBO), polyimide, benzocyclobutene (BCB), a combination thereof, or the like. The insulating layer 106 is formed by a suitable fabrication technique such as spin-coating, lamination, deposition or the like.

Thereafter, one or more patch antennas PA are formed over the insulating layer 112. Specifically, the patch antennas PA are at the backside or first side of the semiconductor die 100 and over the patch antenna ground PGA. In some embodiments, the patch antennas PA includes copper, nickel, titanium, a combination thereof, or the like. The patch antennas PA are formed by a suitable process such as evaporation, plating, or screen printing. The patch antennas PA may be square, rectangular, polygonal, round, elliptical or any suitable shape.

Hereinafter, one patch antenna PA is described below for simplicity and clarity of illustration. In some embodiments, the patch antenna PA has a first region 20, a second region 22 and a filter region 21 between and in physical contact with the first region 20 and the second region 22, as shown in FIG. 2. In some embodiments, the second region 22 surrounds the filter region 21, and the filter region 21 surrounds the first region 20.

In the disclosure, the filter region 21 of the patch antenna PA is configured to filter signals of different frequency bands. In some embodiments, the filter region 21 of the patch antenna PA blocks a first operating frequency band but permits a second operating frequency band to pass therethrough. By disposing the filter region 21 in the patch antenna PA, the first region 20 of the patch antenna PA radiates a first frequency band, and the entire region (including the first region 20, the filter region 21 and the second region 22) of the patch antenna PA radiates a second frequency band different from the first frequency band. In some embodiments, the first frequency band is greater than the second frequency band. For example, the first frequency band of the patch antenna PA is 60 GHz, and the second frequency band of the patch antenna PA is 38 GHz.

The antenna dimensions are inverse proportional with the frequencies. Therefore, the patch antenna PA can irradiate different frequency bands by controlling the length L1 of first region 20 and the total length L2 of all regions of the patch antenna PA. For example, when the first frequency band is 60 GHz and the second frequency band is 38 GHz, the length L1 and the length L2 are in a ratio of 1/60:1/38.

In some embodiments, the filter region 21 of the patch antenna PA has one or more voids V2 therein. In some embodiments, as shown in the top view of FIG. 2, four voids V2 are provided in the filter region 21 of the patch antenna PA. In some embodiments, each of the voids V2 is L-shaped having a turning point, and the voids V2 are disposed around four corners of the first region 20. In some embodiments, the voids V2 penetrate through the filter region 21 of the patch antenna PA. In alternative embodiments, the voids V2 do not penetrate through the filter region 21 of the patch antenna PA. The voids V2 may be L-shaped, strip-shaped, square, rectangular, polygonal, round, elliptical or any shape. The size and the shape of the voids V2 can be adjusted until the filter region 21 has the desired filtering function.

Referring to FIG. 1F, an optional protection layer 114 is formed over the patch antennas PA. In some embodiments, the protection layer 114 is a polymer layer. For example, the protection layer 114 includes a photo-sensitive material such as polybenzoxazole (PBO), polyimide, benzocyclobutene (BCB), a combination thereof, or the like. In some embodiments, the protection layer 114 further fills in the voids V2 in the filter region 21 of each patch antenna PA. An integrated fan-out package 1 having a multi-band antenna is thus completed. In some embodiments, the operation of forming the protection layer 114 can be omitted upon the process requirements. That is, the patch antennas PA of the integrated fan-out package is exposed to the external environment.

Possible modifications and alterations can be made to the filter part of the dipole antenna. These modifications and alterations are provided for illustration purposes, and are not construed as limiting the present disclosure. FIG. 3 to FIG. 6 are top views of dipole antennas in accordance with some embodiments.

Figure 3:
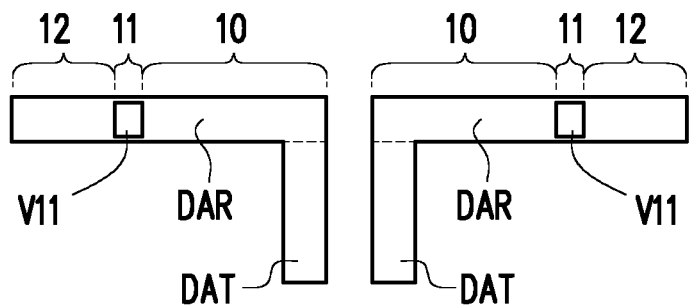
FIG. 3 to FIG. 6 are top views of dipole antennas in accordance with some embodiments.

The dipole antenna of FIG. 3 is similar to the dipole antenna of FIG. 2, and the difference between them lies in that, multiple voids V1 is provided in the filter part 11 of the dipole antenna of FIG. 2, while only one void V11 is provided in the filter part 11 of the dipole antenna of FIG. 3.

Figure 4:
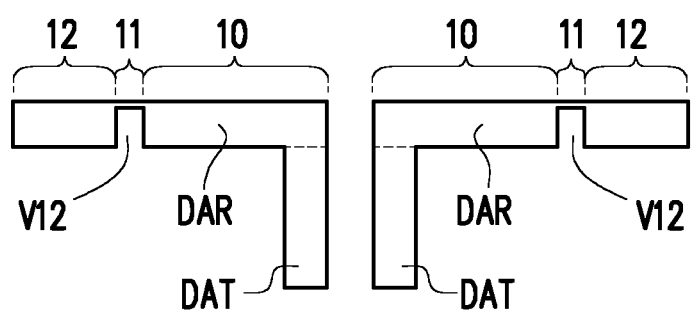

The dipole antenna of FIG. 4 is similar to the dipole antenna of FIG. 2, and the difference between them lies in that, each of the voids V1 in the filter part 11 of the dipole antenna of FIG. 2 is an enclosed slot from a top view, while the recess V12 in the filter part 11 of the dipole antenna of FIG. 4 is a slot having an closed end and an open end opposite to the closed end. Specifically, the dipole antenna of FIG. 4 has one recess V12 on the sidewall of the filter part 11 thereof.

Figure 5:
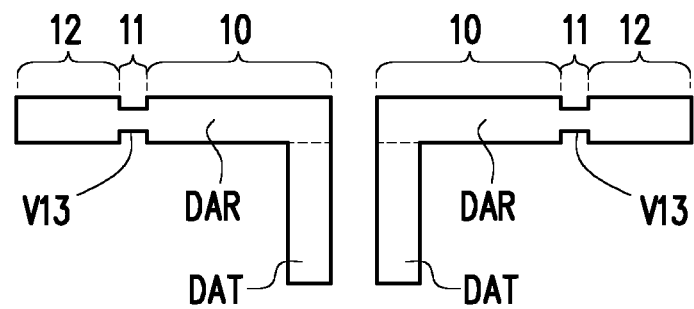

The dipole antenna of FIG. 5 is similar to the dipole antenna of FIG. 4, and the difference between them lies in that, only one recess V12 is provided on the sidewall of the filter part 11 of the dipole antenna of FIG. 4, while two recesses V13 are provided on opposite sidewalls of the filter part 11 of the dipole antenna of FIG. 5.

Figure 6:
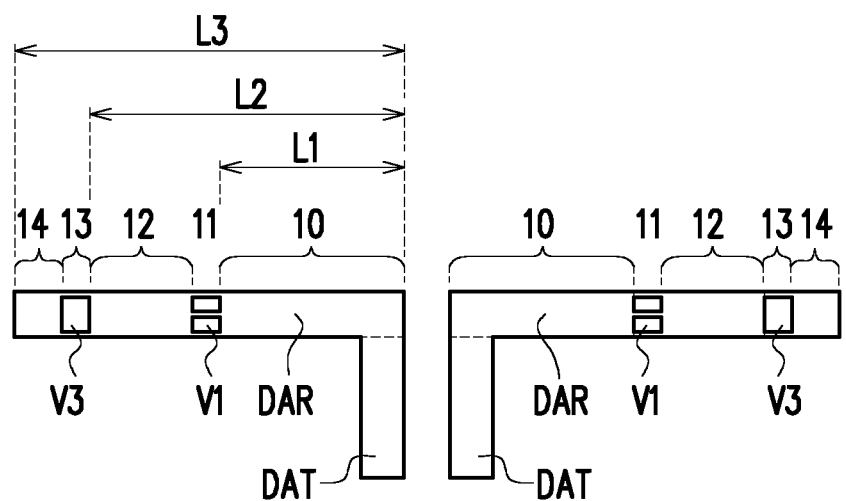

The dipole antenna of FIG. 6 is similar to the dipole antenna of FIG. 2, and the difference between them lies in that, the radiating strip DAR of the dipole antenna of FIG. 6 further has another filter part 13 and a third part 14, and the filter part 13 is between and in physical contact with the second part 12 and the third part 14.

In some embodiments, the filter part 11 of the radiating strip DAR blocks a first operating frequency band but permits a second operating frequency band to pass therethrough, and the filter part 13 of the radiating strip DAR blocks the second operating frequency band but permits a third operating frequency band to pass therethrough. Specifically, the dipole antenna in FIG. 6 is a triple-band dipole antenna. However, the present disclosure is not limited thereto. A quadruple-band dipole antenna, a quintuple-band dipole antenna or an n-tuple-band dipole antenna can be similarly obtained by adding more filter parts in the dipole antenna.

The antenna dimensions are inverse proportional with the frequencies. Therefore, the dipole antenna DA of FIG. 6 can irradiate different frequency bands by controlling the length L1 of the first part 10, the combined length L2 of the first part 10, the filter part 11 and the second part 12, and the total length L3 of all parts of the radiating strip DAR thereof. For example, when the first frequency band is 60 GHz, the second frequency band is 38 GHz, and the third frequency band is 28 GHz, the length L1, the length L2 and the length L3 are in a ratio of 1/60:1/38:1/28.

In some embodiments, the cross-sectional area of the filter part 11 is less than the cross-sectional area of the first part 10 or the second part 12 of the radiating strip DAR, and the cross-sectional area of the filter part 13 is less than the cross-sectional area of the second part 12 or the third part 14 of the radiating strip DAR. In some embodiments, the filter part 11, the second part 12 and the third part have the same cross-sectional area. In alternative embodiments, the filter part 11, the second part 12 and the third part have different cross-sectional areas. In some embodiments, the cross-sectional area of the filter part 11 is greater than the cross-sectional area of the filter part 13.

In some embodiments, the filter part 13 of the radiating strip DAR has one or more voids V3 therein. In some embodiments, as shown in the top view of FIG. 6, a single void V3 is provided in the filter part 13 of the radiating strip DAR. In some embodiments, the void V3 penetrates through the filter part 13 of the radiating strip DAR. In alternative embodiments, the void V3 does not penetrate through the filter part 11 of the radiating strip DAR. The void V3 may be square, rectangular, polygonal, round, elliptical, strip-shaped or any shape. The size and the shape of the void V3 can be adjusted until the filter part 13 has the desired filtering function.

Figure 7:
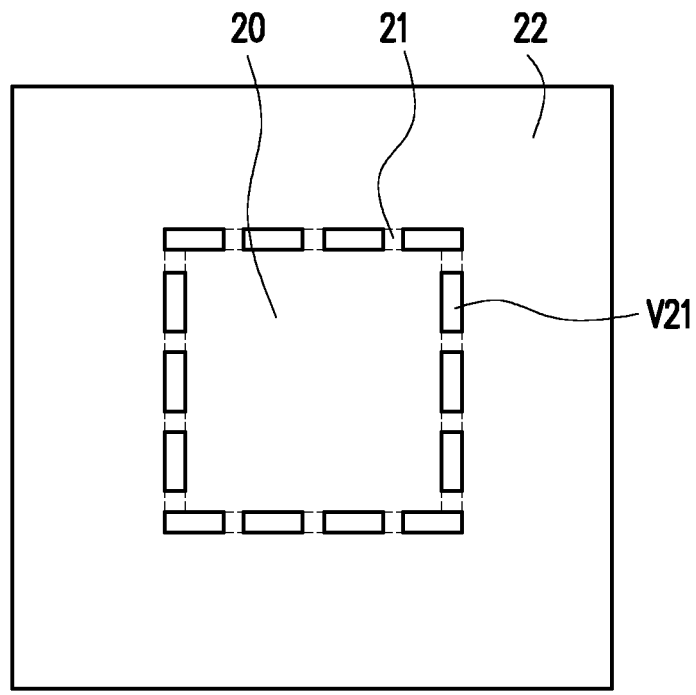
FIG. 7 and FIG. 8 are top views of patch antennas in accordance with some embodiments.
Figure 8:
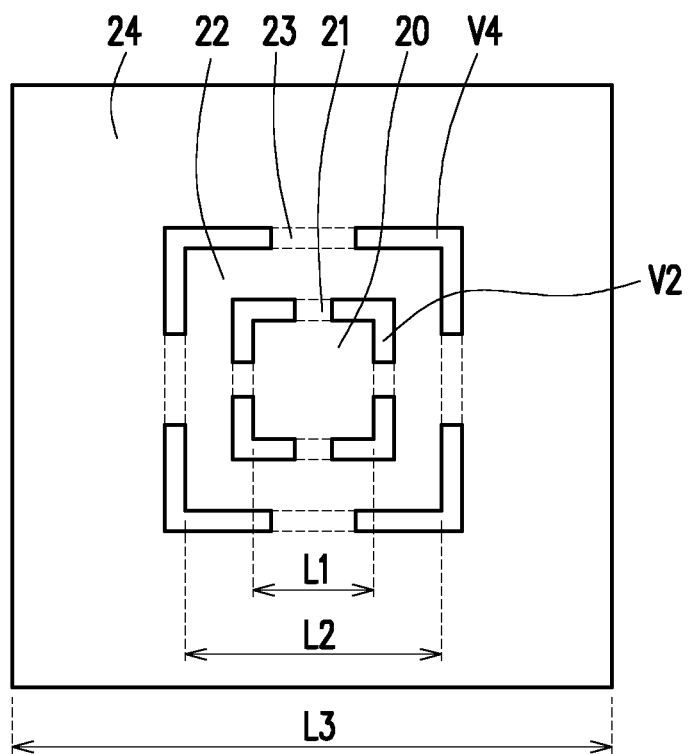

Possible modifications and alterations can be made to the filter region of the patch antenna. These modifications and alterations are provided for illustration purposes, and are not construed as limiting the present disclosure. FIG. 7 and FIG. 8 are top views of patch antennas in accordance with some embodiments.

The patch antenna of FIG. 7 is similar to the patch antenna of FIG. 2, and the difference between them lies in that, multiple rectangular voids V21 are provided in the filter region 21 of the patch antenna of FIG. 7, while multiple L-shaped voids V2 are provided in the filter region 21 of the patch antenna of FIG. 2.

The patch antenna of FIG. 8 is similar to the patch antenna of FIG. 2, and the difference between them lies in that, the patch antenna of FIG. 8 further has another filter region 23 and a third region 24, and the filter region 23 is between and in physical contact with the second region 22 and the third region 24. In some embodiment, the third region 24 surrounds the filter region 23, the filter region 23 surrounds the second region 22, the second region 22 surrounds the filter region 21, and the filter region 21 surrounds the first region 20.

In some embodiments, the filter region 21 of the patch antenna PA blocks a first operating frequency band but permits a second operating frequency band to pass therethrough, and the filter region 23 of the patch antenna PA blocks the second operating frequency band but permits a third operating frequency band to pass therethrough. Specifically, the patch antenna in FIG. 8 is a triple-band patch antenna. However, the present disclosure is not limited thereto. A quadruple-band patch antenna, a quintuple-band patch antenna or an n-tuple-band patch antenna can be similarly obtained by adding more filter regions in the patch antenna.

The antenna dimensions are inverse proportional with the frequencies. Therefore, the patch antenna PA of FIG. 8 can irradiate different frequency bands by controlling the length L1 of the first region 20, the combined length L2 of the first region 20, the filter region 21 and the second region 22, and the total length L3 of all regions of the patch antenna PA. For example, when the first frequency band is 60 GHz, the second frequency band is 38 GHz, and the third frequency band is 28 GHz, the length L1, the length L2 and the length L3 are in a ratio of 1/60:1/38:1/28.

In some embodiments, the filter region 23 of the patch antenna has one or more voids V4 therein. In some embodiments, as shown in the top view of FIG. 8, multiple L-shaped voids V4 are provided in the filter region 23 of the patch antenna. In some embodiments, the voids V4 penetrate through the filter region 23 of the patch antenna. In alternative embodiments, the voids V4 do not penetrate through the filter region 23 of the patch antenna. The voids V4 may be L-shaped, strip-shaped, square, rectangular, polygonal, round, elliptical or any shape. The size and the shape of the voids V4 can be adjusted until the filter region 23 has the desired filtering function.

The structures of the integrated fan-out packages are illustrated below with reference to FIG. 2 to FIG. 8 and FIG. 1F.

An integrated fan-out package 1 includes a semiconductor die 100, a molding layer 108 and a plurality of through integrated fan-out vias TIV2. The molding layer 108 is aside the semiconductor die 100. The through integrated fan-out vias TIV2 are through the molding layer and arranged to form a plurality of dipole antennas DA. In some embodiments, at least one of the dipole antennas DA includes two dipole arms each having a transmitting strip DAT and a radiating strip DAR connected to the transmitting strip DAT, and the radiating strip DAR has a first part 10, a second part 12 and a filter part 11 between and in contact with the first part 10 and the second part 12. In some embodiments, the cross-sectional area of the filter part 11 is less than the cross-sectional area of the first part 10 or the second part 12 of the radiating strip DAR.

In some embodiments, the filter part 11 of the radiating strip DAR has at least one void V1/V11 therein, as shown in FIG. 2 and FIG. 3. The at least one void V1/V11 penetrates through the filter part 11 of the radiating strip DAR. In some embodiments, the molding layer 108 fills in the at least one void V1/V11 in the filter part 11 of the radiating strip DAR. In alternative embodiments, the filter part 11 of the radiating strip DAR has at least one recess V12/V13 on the sidewall thereof, as shown in FIG. 4 and FIG. 5.

In some embodiments, the radiating strip DAR further has another filter part 13 and a third part 14, and the another filter part 13 is between and in contact with the second part 12 and the third part 14, as shown in FIG. 6. In some embodiments, the filter part 13 has at least one void V3 therein. In alternative embodiments, the filter part 13 has at least one recess on the sidewall thereof.

In some embodiments, the integrated fan-out package 1 further includes a first redistribution layer structure RDL1 and at least one patch antenna PA. The first redistribution layer structure RDL is at the backside or first side of the semiconductor die 100 and arranged to form a patch antenna ground PAG. The at least one patch antenna PA is at the backside or first side of the semiconductor die 100 and over the patch antenna ground PAG.

In some embodiments, the patch antenna PA has a first region 20, a second region 22 and a filter region 21 between and in contact with the first region 20 and the second region 22. In some embodiments, the second region 22 surrounds the filter region 21 of the patch antenna PA, and the filter region 21 surrounds the first region 20. In some embodiments, the filter region 21 of the patch antenna has at least one void V2/V21 therein, as shown in FIG. 2 and FIG. 7. In some embodiments, the at least one void V2/V21 penetrates through the filter region 21 of the patch antenna PA.

In some embodiments, the patch antenna PA further has another filter region 23 and a third region 24, and the filter region 23 is between and in contact with the second region 22 and the third region 24. In some embodiments, the filter region 23 has at least one void V4 therein, as shown in FIG. 8.

The shapes, sizes, variations, configurations and distributions of the voids or recesses in the filter part(s) of the dipole antenna and the filter region(s) of the patch antenna are not limited by the present disclosure. Rather, those parameters can be adjusted upon the design requirements, as long as the filter part(s) of the dipole antenna and the filter region(s) of the patch antenna can filter signals of different frequency bands.

The above embodiments in which a multi-band antenna is designed to have at least one void or recess in the filter part/region thereof are provided for illustration purposes, and are not construed as limiting the present disclosure. In alternative embodiments, a multi-band antenna can be designed in a different way.

Figure 9:
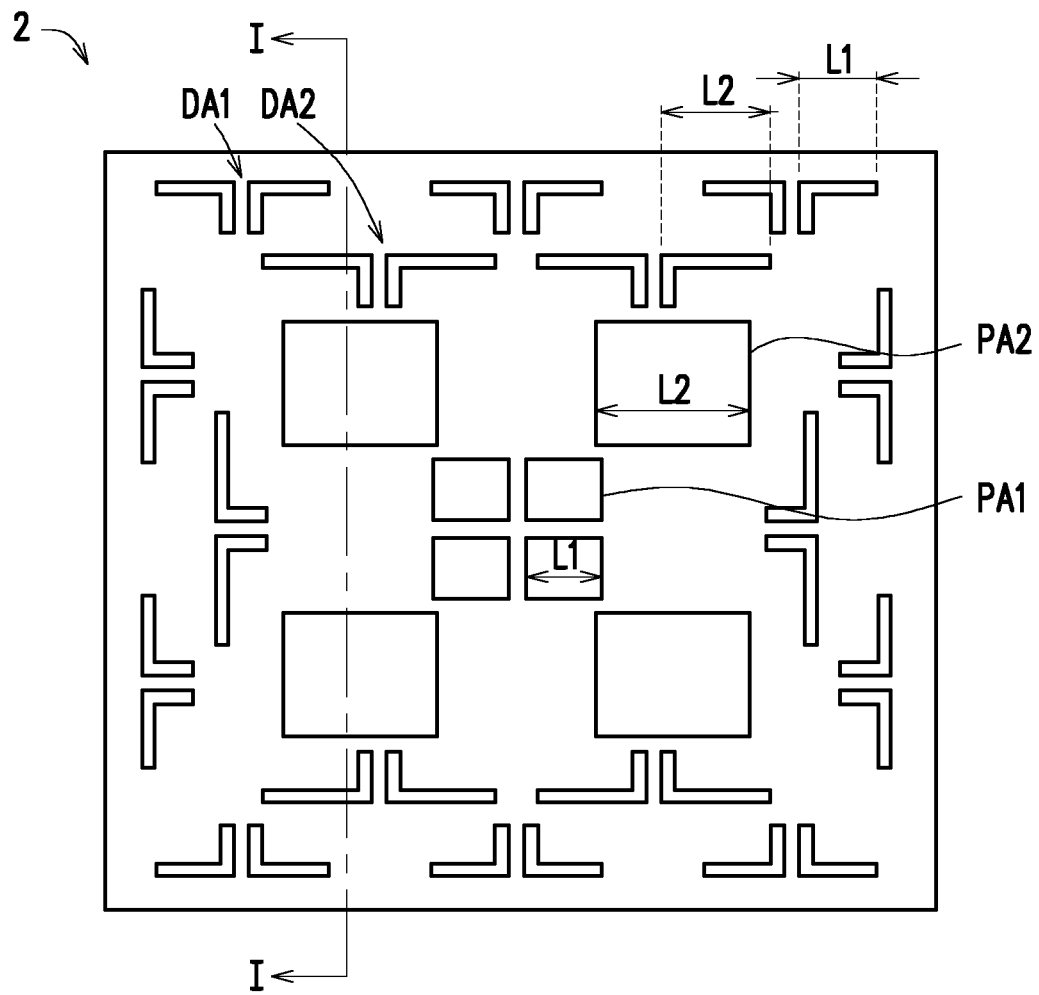
FIG. 9 is a simplified top view of an integrated fan-out package having a multi-band antenna in accordance with alternative embodiments.

FIG. 9 is a simplified top view of an integrated fan-out package having a multi-band antenna in accordance with alternative embodiments. The integrated fan-out package of FIG. 9 is formed with a method similar to that described in FIG. 1A to FIG. 1F, so the details are not iterated herein. In some embodiments, FIG. 1F is a simplified top view taken along the line I-I of FIG. 9.

Referring to FIG. 9 and FIG. 1F, an integrated fan-out package 2 has a multi-band antenna and includes a semiconductor die 100, a molding layer 108, a plurality of first through integrated fan-out vias (not shown in the cross-section depicted in FIG. 1F) and a plurality of second through integrated fan-out vias (shown as TIV2 in FIG. 1F). The molding layer 108 is aside the semiconductor die 100. The first through integrated fan-out vias are through the molding layer 108 and are arranged to form a plurality of first dipole antennas DA1. The second through integrated fan-out vias are through the molding layer 108 and are arranged to form a plurality of second dipole antennas DA2. In some embodiments, the first dipole antennas DA1 surround the second dipole antennas DA2, and the first dipole antennas DA1 and the second dipole antennas DA2 are in a staggered arrangement. Specifically, one of the second dipole antennas DA2 is between two of the first dipole antennas DA1, and the first and second dipole antennas DA1 and DA2 are arranged in a zigzag arrangement.

In some embodiments, the length L1 of the radiating strips of the first dipole antennas DA1 is different from the length L2 of the radiating strips of the second dipole antennas DA2. In some embodiments, the length L1 is less than the length L2, as shown in FIG. 9. However, the present disclosure is not limited thereto. In alternative embodiments, the length L1 is greater than the length L2.

In some embodiments, the operating frequency band of the first dipole antennas DA1 is different from the operating frequency band of the second dipole antennas DA2. In some embodiments, the operating frequency band of the first dipole antennas DA1 is greater than the operating frequency band of the second dipole antennas DA2. For example, the operating frequency band of the first dipole antennas DA1 is 60 GHz, and the operating frequency band of the second dipole antennas DA2 is 38 GHz. However, the present disclosure is not limited thereto. In alternative embodiments, the operating frequency band of the first dipole antennas DA1 can be less than the operating frequency band of the second dipole antennas DA2 upon the process requirements.

The integrated fan-out package 2 further includes a first redistribution layer structure RDL1, one or more first patch antennas PA1 (not shown in the cross-section depicted in FIG. 1F) and one or more second patch antennas PA2 (shown as PA in FIG. 1F).

The first redistribution layer structure RDL1 is at the backside or first side of the semiconductor die 100 and is arranged to form a patch antenna ground PAG. The first and second patch antennas PA1 and PA2 are at the backside or first side of the first semiconductor die 100 and over the patch antenna ground PAG.

In some embodiments, the second patch antennas PA2 surround the first patch antennas PA1. In some embodiments, the length L1 of the first patch antennas PA1 is different from the length L2 of the second patch antennas PA2. In some embodiments, the length L1 is less than the length L2, as shown in FIG. 9. However, the present disclosure is not limited thereto. In alternative embodiments, the length L1 is greater than the length L2.

In some embodiments, the operating frequency band of the first patch antennas PA1 is different from the operating frequency band of the second patch antennas PA2. In some embodiments, the operating frequency band of the first patch antennas PA1 is greater than the operating frequency band of the second patch antennas PA2. For example, the operating frequency band of the first patch antennas PA1 is 60 GHz, and the operating frequency band of the second patch antennas PA2 is 38 GHz. However, the present disclosure is not limited thereto. In alternative embodiments, the operating frequency band of the first patch antennas PA1 can be less than the operating frequency band of the second patch antennas PA2 upon the process requirements.

With the arrangement of FIG. 9, the antenna structure of the integrated fan-out package 2 is configured to have a dual-band dipole antenna and a dual-band patch antenna.

Figure 10:
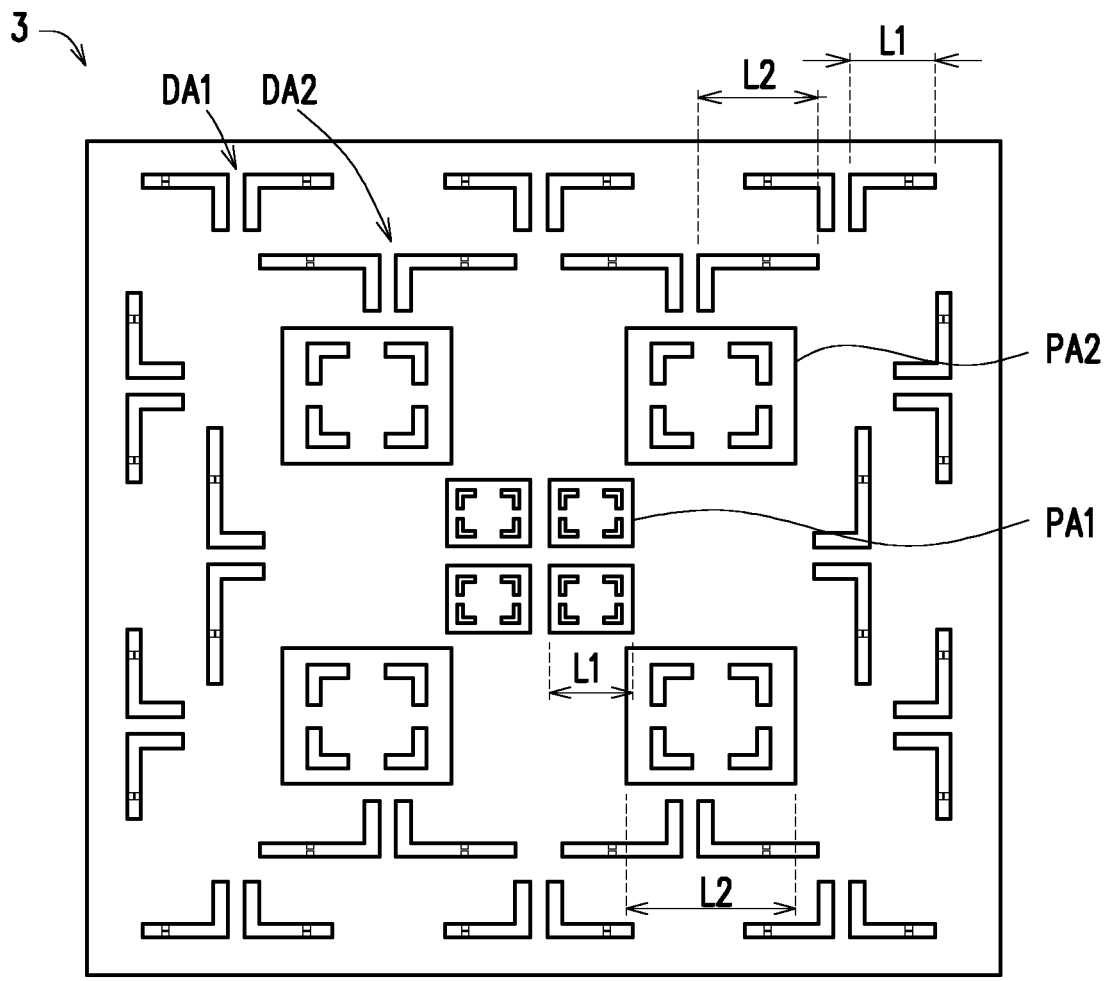
FIG. 10 is a simplified top view of an integrated fan-out package having a multi-band antenna in accordance with yet alternative embodiments.

It is appreciated by people having ordinary skill in the art that the concept of the multi-band antenna of FIG. 2 can be applied to and combined with the antenna structure of FIG. 9. By such combination, the antenna structure of the integrated fan-out package 3 is configured to have a quadruple-band dipole antenna and a quadruple-band patch antenna, as shown in FIG. 10. Besides, the modifications and alterations described in FIG. 3 to FIG. 8 can be applied to the antenna structure of FIG. 10 upon the process requirements.

In view of the above, in some embodiments of the present disclosure, a multi-band dipole antenna and a multi-band patch antenna are formed during the formation of an integrated fan-out package, so the process can be greatly simplified and the package size can be significantly reduced.

In accordance with some embodiments of the present disclosure, an integrated fan-out package has a multi-band antenna and includes a semiconductor die, a molding layer and a plurality of through integrated fan-out vias. The molding layer is aside the semiconductor die. The through integrated fan-out vias are through the molding layer and arranged to form a plurality of dipole antennas. At least one of the plurality of dipole antennas includes two dipole arms each having a transmitting strip and a radiating strip connected to the transmitting part, and the radiating strip has a first part, a second part and a filter part between and in contact with the first part and the second part, wherein a cross-sectional area of the filter part is less than a cross-sectional area of the first part or the second part of the radiating strip.

In accordance with alternative embodiments of the present disclosure, an integrated fan-out package has a multi-band antenna and includes a semiconductor die, a molding layer, a plurality of first through integrated fan-out vias and a plurality of second through integrated fan-out vias. The molding layer aside the semiconductor die. The first through integrated fan-out vias are through the molding layer and arranged to form a plurality of first dipole antennas. The second through integrated fan-out vias are through the molding layer and arranged to form a plurality of second dipole antennas. The operating frequency band of the first dipole antennas is different from an operating frequency band of the second dipole antennas, and the first dipole antennas and the second dipole antennas are in a staggered arrangement.

In accordance with yet alternative embodiments of the present disclosure, a method of forming an integrated fan-out package having a multi-band antenna includes the following operations. A semiconductor die is provided. A plurality of through integrated fan-out vias is formed aside the semiconductor die, wherein forming the through integrated fan-out vias includes forming a plurality of dipole antennas. A molding layer is formed to surround the through integrated fan-out vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package having a multi-band antenna, comprising:
   a semiconductor die; and
   a plurality of antennas adjacent to the semiconductor die, wherein at least one of the plurality of antennas comprises at least one insulating portion embedded in and surrounded by a conductive portion.

2. The integrated fan-out package of claim 1, wherein the antennas are dipole antennas that penetrate through a molding compound aside the semiconductor die, each dipole antenna comprises two dipole arms, each dipole arm has a transmitting strip and a radiating strip connected to the transmitting strip, the radiating strip has a first part, a second part and a filter part between and in contact with the first part and the second part, and the at least one insulating portion is embedded in the filter part of the radiating strip.

3. The integrated fan-out package of claim 2, wherein the at least one insulating portion penetrates through the filter part of the radiating strip.

4. The integrated fan-out package of claim 2, wherein the at least one insulating portion does not penetrate through the filter part of the radiating strip.

5. The integrated fan-out package of claim 2, wherein the radiating strip further has another filter part and a third part, and the another filter part is between and in contact with the second part and the third part.

6. The integrated fan-out package of claim 1, wherein the antennas are patch antennas that are disposed at a backside of the semiconductor die, each patch antenna has a first region, a second region and a filter region between and in contact with the first region and the second region, and the at least one insulating portion is embedded in the filter region of the patch antenna.

7. The integrated fan-out package of claim 6, wherein the second region surrounds the filter region of the patch antenna.

8. The integrated fan-out package of claim 6, wherein the at least one insulating portion penetrates through the filter part of the patch antenna.

9. The integrated fan-out package of claim 6, wherein the at least one insulating portion does not penetrate through the filter part of the patch antenna.

10. An integrated fan-out package having a multi-band antenna, comprising:
    a semiconductor die;
    a molding layer aside the semiconductor die;
    a plurality of first through integrated fan-out vias through the molding layer; and
    a plurality of first dipole antennas through the molding layer,
    wherein a dimension of the through integrated fan-out vias is different from a dimension of the first dipole antennas.

11. The integrated fan-out package of claim 10, further comprising a plurality of second dipole antennas, wherein an operating frequency band of the first dipole antennas is different from an operating frequency band of the second dipole antennas, and the first dipole antennas and the second dipole antennas are in a staggered arrangement.

12. The integrated fan-out package of claim 11, wherein the first dipole antennas surround the second dipole antennas, and the operating frequency band of the first dipole antennas is greater than the operating frequency band of the second dipole antennas.

13. The integrated fan-out package of claim 11, wherein at least one of the first and second dipole antennas comprises two dipole arms each having a transmitting strip and a radiating strip connected to the transmitting strip, and the radiating strip has a first part, a second part and a filter part between and in contact with the first part and the second part, and wherein a cross-sectional area of the filter part is less than a cross-sectional area of the first part or the second part of the radiating strip.

14. The integrated fan-out package of claim 13, wherein at least one insulating portion is embedded in the filter part of the radiating strip.

15. The integrated fan-out package of claim 10, further comprising a first redistribution layer structure at a first side of the semiconductor die and arranged to form a patch antenna ground.

16. The integrated fan-out package of claim 15, further comprising at least one patch antenna at the first side of the semiconductor die and over the patch antenna ground.

17. The integrated fan-out package of claim 16, wherein the patch antenna has a first region, a second region and a filter region between and in contact with the first region and the second region, and at least one insulating portion is embedded in the filter region of the patch antenna.

18. The integrated fan-out package of claim 17, wherein the second region surrounds the filter region of the patch antenna.

19. A method of forming an integrated fan-out package having a multi-band antenna, comprising:
providing a semiconductor die;
forming a plurality of through integrated fan-out vias and a plurality of dipole antennas aside the semiconductor die, wherein at least one void is formed through at least one of the dipole antennas; and
forming a molding layer surrounding the through integrated fan-out vias and the dipole antennas.

20. The method of claim 19, wherein a dimension of the through integrated fan-out vias is different from a dimension of the dipole antennas.

* * * * *